United States Patent
Park et al.

(10) Patent No.: US 10,504,866 B2
(45) Date of Patent: Dec. 10, 2019

(54) SEMICONDUCTOR DEVICE CONNECTED BY ANISOTROPIC CONDUCTIVE FILM

(71) Applicants: Young Woo Park, Uiwang-si (KR); Joon Mo Seo, Uiwang-si (KR); Hyun Min Choi, Uiwang-si (KR); Ji Yeon Kim, Uiwang-si (KR); Kyoung Soo Park, Uiwang-si (KR); Arum Yu, Uiwang-si (KR); Jong Hyuk Eun, Uiwang-si (KR)

(72) Inventors: Young Woo Park, Uiwang-si (KR); Joon Mo Seo, Uiwang-si (KR); Hyun Min Choi, Uiwang-si (KR); Ji Yeon Kim, Uiwang-si (KR); Kyoung Soo Park, Uiwang-si (KR); Arum Yu, Uiwang-si (KR); Jong Hyuk Eun, Uiwang-si (KR)

(73) Assignee: Kudko Chemical Co., Ltd., Seoul (KR)

( * ) Notice: Subject to any disclaimer, the term of this patent is extended or adjusted under 35 U.S.C. 154(b) by 185 days.

(21) Appl. No.: 14/030,127

(22) Filed: Sep. 18, 2013

(65) Prior Publication Data

US 2014/0084468 A1 Mar. 27, 2014

(30) Foreign Application Priority Data

Sep. 21, 2012 (KR) ............ 10-2012-0105195

(51) Int. Cl.
*B32B 27/00* (2006.01)
*B32B 27/08* (2006.01)
(Continued)

(52) U.S. Cl.
CPC ............ *H01L 24/29* (2013.01); *H01L 24/83* (2013.01); *C09J 2201/602* (2013.01); *H01L 24/27* (2013.01); *H01L 2224/293* (2013.01); *H01L 2224/2929* (2013.01); *H01L 2224/2939* (2013.01); *H01L 2224/29339* (2013.01); *H01L 2224/29344* (2013.01); *H01L 2224/29347* (2013.01); *H01L 2224/29355* (2013.01); *H01L 2224/29388* (2013.01); *H01L 2224/29439* (2013.01); *H01L 2224/29444* (2013.01); *H01L 2224/29455* (2013.01); *H01L 2224/32225* (2013.01); *H01L 2224/73204* (2013.01); *H01L 2224/83203* (2013.01); *H01L 2224/83862* (2013.01); *H01L 2924/07802* (2013.01)

(58) Field of Classification Search
None
See application file for complete search history.

(56) References Cited

U.S. PATENT DOCUMENTS

2006/0118767 A1* 6/2006 Jang .................. H01B 1/22
  252/500
2006/0154078 A1* 7/2006 Watanabe et al. .......... 428/413
(Continued)

FOREIGN PATENT DOCUMENTS

| CN | 101016402 A | 8/2007 |
| TW | I314571 B | 9/2009 |
| TW | 201108253 A1 | 3/2011 |

OTHER PUBLICATIONS

DIC Corporation: EPICLON epoxy resins—high performance types. Retrieved on Jul. 9, 2015. http://www.dic-global.com/eu/en/products/epoxy/high_performance/.*
(Continued)

*Primary Examiner* — Coris Fung
(74) *Attorney, Agent, or Firm* — Lee & Morse, P.C.

(57) ABSTRACT

A semiconductor device includes a first connecting member having a first electrode, a second connecting member having a second electrode, and an anisotropic conductive film between the first connecting member and the second connecting member, the anisotropic conductive film electrically connecting the first and second electrodes to each other. The anisotropic conductive film includes a polymer binder resin, an epoxy resin, conductive particles, and a curing agent. The epoxy resin includes a naphthalene ring-containing epoxy resin and a dicyclopentadiene ring-containing epoxy resin. The naphthalene ring-containing epoxy resin is included in an amount of 100 parts by weight to 500 parts by weight based on 100 parts by weight of the dicyclopentadiene ring-containing epoxy resin.

6 Claims, 1 Drawing Sheet

(51) Int. Cl.
*B32B 27/38* (2006.01)
*H01L 23/00* (2006.01)

(56) References Cited

U.S. PATENT DOCUMENTS

| | | | | |
|---|---|---|---|---|
| 2006/0252234 A1* | 11/2006 | Saiki | ............................. | 438/464 |
| 2007/0054114 A1* | 3/2007 | Kumakura | .................... | 428/343 |
| 2009/0140210 A1* | 6/2009 | Toshioka | ............. | C08G 59/621 |
| | | | | 252/500 |
| 2009/0143511 A1* | 6/2009 | Ikezawa | ............... | C08G 59/621 |
| | | | | 524/127 |
| 2009/0311827 A1* | 12/2009 | Ishizawa et al. | ............. | 438/107 |
| 2013/0266812 A1* | 10/2013 | Zeng et al. | .................. | 428/416 |

OTHER PUBLICATIONS

Taiwanese Office Action dated Sep. 10, 2015 in Corresponding Taiwanese Patent Application No. 102133895.
Chinese Office Action dated Nov. 15, 2014.

* cited by examiner

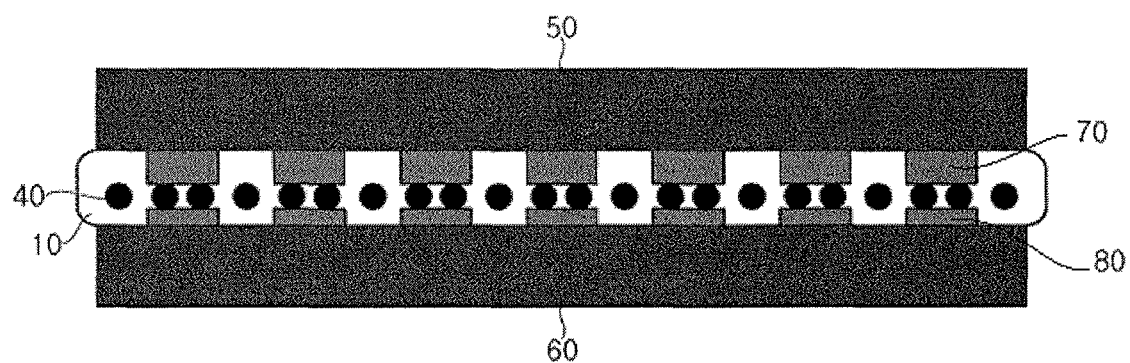

SEMICONDUCTOR DEVICE CONNECTED BY ANISOTROPIC CONDUCTIVE FILM

CROSS-REFERENCE TO RELATED APPLICATION

Korean Patent Application No. 10-2012-0105195, filed on Sep. 21, 2012, in the Korean Intellectual Property Office, and entitled: "Semiconductor Device Connected by Anisotropic Conductive Film," is incorporated by reference herein in its entirety.

BACKGROUND

1. Field

Embodiments relate to a semiconductor device connected by an anisotropic conductive film.

2. Description of the Related Art

Generally, anisotropic conductive films (ACFs) are film-like adhesives in which conductive particles, such as metal particles including nickel or gold particles or metal-coated polymer particles, are dispersed in a resin, such as an epoxy resin. The term "anisotropic conductive film" may refer to a film including a polymer layer having electric anisotropy and adhesive properties, and that exhibits conductive properties in the thickness direction of the film and insulating properties in the surface direction thereof.

When an anisotropic conductive film disposed between circuit boards to be connected is subjected to heating and pressing under certain conditions, circuit terminals are electrically connected through conductive particles and an insulating adhesive resin fills spaces between adjacent circuit terminals to isolate the conductive particles from each other, thereby providing high insulation performance between circuit terminals.

Among anisotropic conductive films, an anisotropic conductive film for chip-on-glass (COG) refers to a connection material used in mounting a driver IC on a panel of a liquid crystal display (LCD), and the like.

SUMMARY

Embodiments are directed to a semiconductor device including a first connecting member having a first electrode, a second connecting member having a second electrode, and an anisotropic conductive film between the first connecting member and the second connecting member, the anisotropic conductive film electrically connecting the first and second electrodes to each other. The anisotropic conductive film includes a polymer binder resin, an epoxy resin, conductive particles, and a curing agent. The epoxy resin includes a naphthalene ring-containing epoxy resin and a dicyclopentadiene ring-containing epoxy resin. The naphthalene ring-containing epoxy resin is in an amount of 100 parts by weight to 500 parts by weight based on 100 parts by weight of the dicyclopentadiene ring-containing epoxy resin.

The anisotropic conductive film may include 5 wt % to 35 wt % of the polymer binder resin, 5 wt % to 40 wt % of the epoxy resin, 5 wt % to 30 wt % of the conductive particles, and 5 wt % to 50 wt % of the curing agent, based on the total amount of the anisotropic conductive film in terms of solid content.

The anisotropic conductive film may include silica nanoparticles.

The anisotropic conductive film may have a melting viscosity from 0.2 Pa·s to 0.5 Pa·s at 150° C.

The anisotropic conductive film may have a moisture absorption rate of 0.8% or less.

The anisotropic conductive film may have an adhesive strength from 30 N/25 mm to 100 N/25 mm.

The dicyclopentadiene ring-containing epoxy resin may have a melting viscosity from 0.1 Pa·s to 1 Pa·s at 150° C.

The anisotropic conductive film, after curing and after being subjected to conditions of 85° C. and 85% RH for 500 hours, may have a connection resistance of 10Ω or less.

The curing may be performed at 190° C. to 210° C. for 5 seconds to 10 seconds at a load of 50 MPa to 80 MPa.

The anisotropic conductive film, after curing and after being subjected to conditions of 85° C. and 85% RH for 500 hours, may have a bubble area between electrodes of 20% or less in a space area therebetween.

Embodiments are also directed to a semiconductor device connected by an anisotropic conductive film including a naphthalene ring-containing epoxy resin and a dicyclopentadiene ring-containing epoxy resin, the anisotropic conductive film having a melting viscosity from 0.2 Pa·s to 0.5 Pa·s at 150° C. and a moisture absorption rate of 0.8% or less.

The anisotropic conductive film has an adhesive strength from 30 N/25 mm to 100 N/25 mm.

The dicyclopentadiene ring-containing epoxy resin may have a melting viscosity from 0.1 Pa·s to 1 Pa·s at 150° C.

The anisotropic conductive film, after curing and after being subjected to conditions of 85° C. and 85% RH for 500 hours, may have a connection resistance of 10Ω or less.

The curing may be performed at 190° C. to 210° C. for 5 seconds to 10 seconds at a load of 50 MPa to 80 MPa.

The anisotropic conductive film, after curing and after being subjected to conditions of 85° C. and 85% RH for 500 hours, may have a bubble area between electrodes of 20% or less in a space area therebetween.

Embodiments are also directed to a method of preparing a semiconductor device including placing an anisotropic conductive film on a first connecting member including a first electrode and performing preliminary compressing of the anisotropic conductive film on the first connecting member, and disposing a second connecting member including a second electrode on the preliminarily compressed anisotropic conductive film and performing primary compressing. The anisotropic conductive film has a connection resistance of 10Ω or less when left under conditions of 85° C. and 85% RH for 500 hours after curing, and the curing is performed at 190° C. to 210° C. for 5 seconds to 10 seconds at a load of 50 MPa to 80 MPa.

The anisotropic conductive film may have a bubble area between electrodes of 20% or less in a space area therebetween when left under conditions of 85° C. and 85% RH for 500 hours after curing.

A semiconductor device may be prepared by the method.

BRIEF DESCRIPTION OF DRAWINGS

Features will become apparent to those of skill in the art by describing in detail exemplary embodiments with reference to the attached drawings in which:

FIG. 1 illustrates a sectional view of a semiconductor device according to an embodiment. The semiconductor device includes first and second connecting members 50, 60 connected to each other via an anisotropic conductive film 10 and including first and second electrodes 70, 80, respectively. Here, when the anisotropic conductive film 10 is placed and compressed between the first connecting member 50 having the first electrode 70 and the second connecting member 60 having the second electrode 80, the first electrode 70 and the second electrode 80 are electrically connected to each other through conductive particles 40.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figure, the dimensions of layers and regions may be exaggerated for clarity of illustration.

Embodiments relate to a semiconductor device connected by an anisotropic conductive film that exhibits excellent connection reliability even under high temperature and high humidity conditions, and has high heat resistance and high moisture resistance.

More particularly, embodiments provide a semiconductor device connected by an anisotropic conductive film that includes a naphthalene ring-containing epoxy resin having high melting viscosity and a dicyclopentadiene ring-containing epoxy resin having low melting viscosity in a specific content ratio to allow the anisotropic conductive film to sufficiently and uniformly fill spaces between microelectrodes upon primary compressing, thereby providing improved connection reliability by allowing appropriate adjustment of viscosity of a film composition.

One embodiment provides a semiconductor device connected by an anisotropic conductive film, which includes: a) a polymer binder resin; b) an epoxy resin; c) conductive particles; and d) a curing agent, wherein the b) epoxy resin includes a naphthalene ring-containing epoxy resin and a dicyclopentadiene ring-containing epoxy resin, and wherein the naphthalene ring-containing epoxy resin is present in an amount of 100 parts by weight to 500 parts by weight based on 100 parts by weight of the dicyclopentadiene ring-containing epoxy resin.

Hereinafter, the anisotropic conductive film according to the embodiment will be described in detail.

a) Polymer Binder Resin

Any suitable polymer binder resin may be used.

Examples of the polymer binder resin include polyimide resins, polyamide resins, phenoxy resins, epoxy resins, polymethacrylate resins, polyacrylate resins, polyurethane resin, polyester resins, polyester urethane resins, polyvinyl butyral resins, styrene-butylene-styrene (SBS) resins, and epoxy modifications thereof, styrene-ethylene-butylene-styrene (SEBS) resins and modifications thereof, acrylonitrile butadiene rubber (NBR) or hydrogenated compounds thereof. These may be used alone or in combination thereof.

The polymer binder resin may be present in an amount of 5% by weight (wt %) to 35 wt %, or, for example, 10 wt % to 30 wt %, based on the total amount of the anisotropic conductive film composition in terms of solid content. Within this range, the anisotropic conductive film may exhibit excellent adhesion and film formability.

b) Epoxy Resin

According to an implementation, the epoxy resin may include a naphthalene ring-containing epoxy resin and a dicyclopentadiene ring-containing epoxy resin. In addition, the epoxy resin may further include other epoxy resins without limitation so long as the other epoxy resins have compatibility with the naphthalene ring-containing epoxy resin and the dicyclopentadiene ring-containing epoxy resin. For example, other types of polycyclic aromatic ring-containing epoxy resins, and the like, may be included.

In order to impart high heat resistance to the film, the naphthalene ring-containing epoxy resin may have a glass transition temperature from 160° C. to 250° C. after curing and a melting viscosity from about 10 Pa·s to about 100 Pa·s at 150° C. upon curing.

The dicyclopentadiene ring-containing epoxy resin may exhibit excellent heat resistance and moisture resistance and may have a high glass transition temperature after curing. In order to achieve an appropriate adjustment of the melting viscosity of the anisotropic conductive film composition, the dicyclopentadiene ring-containing epoxy resin may have a melting viscosity from about 0.1 Pa·s to about 1 Pa·s at 150° C.

Embodiments also provide a semiconductor device connected by the anisotropic conductive film, the melting viscosity of which is appropriately adjusted by including the naphthalene ring-containing epoxy resin and the dicyclopentadiene ring-containing epoxy resin in a specific content ratio.

According to an implementation, the epoxy resin may be present in an amount of 5 wt % to 40 wt %, or, for example, 10 wt % to 40 wt %, based on the total amount of the anisotropic conductive film composition in terms of solid content.

The naphthalene ring-containing epoxy resin may present in an amount of 100 parts by weight to 500 parts by weight, or, for example, 100 parts by weight to 400 parts by weight, or, for example, 140 parts by weight to 300 parts by weight, based on 100 parts by weight of the dicyclopentadiene ring-containing epoxy resin.

Within this range, the anisotropic conductive film may have an appropriate melting viscosity upon primary compressing and may sufficiently fill spaces between microelectrodes, thereby improving connection reliability.

c) Conductive Particles

The conductive particles may include any suitable conductive particles.

Examples of the conductive particles may include metal particles, including gold (Au), silver (Ag), nickel (Ni), copper (Cu), and solder particles; carbon particles; resin particles, for example, polyethylene, polypropylene, polyester, polystyrene, polyvinyl alcohol and modified resin particles thereof coated with metals such as gold (Au), silver (Ag), nickel (Ni), and the like; and conductive particles further coated with insulating particles.

The size of the conductive particles may be selected within the range of 2 µm to 30 µm depending on the pitch of circuits to be used and depending on the purpose thereof.

The conductive particles may be present in an amount of 5 wt % to 30 wt %, or, for example, 10 wt % to 20 wt %, based on the total amount of the anisotropic conductive film composition in terms of solid content. Within this range, failure of connection and/or insulation of the anisotropic conductive film may be avoided, and excellent connectivity may be ensured.

d) Curing Agent

Any suitable curing agent that can cure epoxy resins and form anisotropic conductive films may be used.

The curing agent may be a latent curing agent, for example. Examples of the curing agent include imidazole, isocyanate, amine, amide, phenolic, acid anhydride curing agents, and the like. These may be used alone or in combination thereof.

The curing agent may be present in an amount of 5 wt % to 50 wt %, or, for example, 20 wt % to 40 wt %, based on the total amount of the anisotropic conductive film composition in terms of solid content. Within this range, the curing agent may ensure sufficient curing of the anisotropic conductive film, and facilitate formation thereof by ensuring excellent compatibility.

The anisotropic conductive film may further include inorganic particles in addition to a), b), c) and d). The inorganic particles may serve to improve adhesion and insulation properties of the anisotropic conductive film.

According to an implementation, the inorganic particles may be silica nanoparticles, as an example.

When the naphthalene ring-containing epoxy and the dicyclopentadiene ring-containing epoxy resin and silica nanoparticles are used together in formation of the anisotropic conductive film, pressure imbalance in a thickness direction upon compression of the film may be reduced or prevented, thereby allowing more efficient filling of the film between electrodes.

The silica nanoparticles may have an average particle size from 1 nm to 50 nm. The silica nanoparticles may be present in an amount of 0.1 wt % to 20 wt %, or, for example, 1 wt % to 10 wt %, based on the total amount of the anisotropic conductive film composition in terms of solid content. Within this range, pressure applied to an electrode may be uniformly distributed, and the anisotropic conductive film may exhibit improved adhesion and connection reliability.

In order to impart additional properties to the anisotropic conductive film without deteriorating fundamental properties thereof, the anisotropic conductive film may further include additives, such as polymerization inhibitors, antioxidants, heat stabilizers, curing accelerators, coupling agents, and the like. The added amount of each of the additives may vary depending on use of the film, desired effects, and the like.

In some implementations, the anisotropic conductive film may have a melting viscosity ranging from about 0.2 Pa·s to about 0.5 Pa·s at 150° C.

The anisotropic conductive film may include the naphthalene ring-containing epoxy resin having high melting viscosity and the dicyclopentadiene ring-containing epoxy resin having low melting viscosity at 150° C. to have an appropriate melting viscosity within the above range. The anisotropic conductive film composition may have an appropriate melting viscosity upon primary compressing and may sufficiently fill spaces between microelectrodes.

The melting viscosity of the anisotropic conductive film or film composition may be measured by any suitable method, for example, by advanced rheometric expansion system (ARES). For example, a rheometer (ARES G2, TA Instruments) may be used as a viscosity tester.

In some implementations, the anisotropic conductive film may have a moisture absorption rate of 0.8% or less, or, for example, 0.75% or less, or, for example, 0.7% or less. Within this range, the anisotropic conductive film may be used for a long time while maintaining excellent connection reliability under high temperature and high humidity conditions.

The moisture absorption rate of the anisotropic conductive film may be measured by measuring the weight change of the anisotropic conductive when left under conditions of 85° C. and 85% RH for 24 hours.

Another embodiment provides a semiconductor device connected by an anisotropic conductive film having a connection resistance of 10Ω or less when left under conditions of 85° C. and 85% RH for 500 hours after curing.

Curing may be performed by primary compressing of the anisotropic conductive film at 190° C. to 210° C. for 5 seconds to 10 seconds at 50~80 MPa.

Any suitable method may be used to measure connection resistance.

The semiconductor device connected by the anisotropic conductive film having a connection resistance of 10Ω or less may be used for a long time even under high temperature and/or high humidity conditions.

Yet another embodiment provides an anisotropic conductive film having a bubble area of 20% or less in a space area between electrodes when left under conditions of 85° C. and 85% RH for 500 hours after curing.

Curing is performed by primary compressing of the anisotropic conductive film at 190° C. to 210° C. for 5 seconds to 10 seconds at 50 MPa to 80 MPa.

The space between the electrodes may be a space between a microelectrode and the electrode. The term "a space between the electrodes" may refer to a space filled with the anisotropic conductive film composition upon compressing.

Any suitable method typically may be used to measure the bubble area. For example, the bubble area may be measured by observation or by photographing the space filled with the film composition between the electrodes using a microscope and calculating the bubble area using an image analyzer or lattice chart.

When the anisotropic conductive film has a bubble area of 20% or less, a semiconductor device connected using the same may be used for a long time even under high temperature and/or high humidity conditions while maintaining connection reliability.

The expression 'bubble area of 20% or less' does not include 0 or negative values. Accordingly, a lower limit of the bubble area may be construed as referring to a positive value close to 0.

Any suitable method may be used to form the anisotropic conductive film.

No special apparatus or equipment is required to form the anisotropic conductive film. For example, the anisotropic conductive film may be obtained by dissolving a binder resin in an organic solvent, adding other components to the binder resin dissolved in the solvent, stirring the components for a predetermined period of time, applying the mixture to an appropriate thickness of, for example, 10 μm to 50 μm, onto a release film, and drying the mixture for a predetermined period of time to volatilize the organic solvent.

According to another embodiment, a semiconductor device may include a first connecting member having a first electrode; a second connecting member having a second electrode; and the anisotropic conductive film, which is disposed between the first and second connecting members and electrically connects the first and second electrodes to each other.

Referring to FIG. 1, the semiconductor device according to the embodiment may include a first connecting member 50 having a first electrode 70; a second connecting member 60 having a second electrode 80; and an anisotropic conductive film 10 including conductive particles 40. When the anisotropic conductive film 10 placed between the first connecting member 50 having the first electrode 70 and the second connecting member 60 having the second electrode is compressed, the first electrode 70 and the second electrode 80 are connected to each other via the conductive particles 40. In one implementation, the first and second connecting members may have similar structures in terms of material, thickness, size and physical interconnectivity. The first and second connecting members have a thickness from about 20 µm to about 100 µm.

In other implementations, the first and second connecting members may have different structures and functions in terms of material, thickness, size and physical interconnectivity. The first connecting member or the second connecting member may be formed of glass, PCB (Printed Circuit Board), fPCB, COF, TCP, ITO glass, and the like, as examples. The first electrode or the second electrode may be a protruding electrode or a flat electrode. When the first and second electrodes are protruding electrodes, these electrodes have a height (H) of about 2.50 µm to about 10 µm, a width (W) of about 50 µm to about 120 µm, and a gap (G) between electrodes of about 50 µm to about 110 µm. For example, the electrodes have a height (H) of about 2.50 µm to about 9 µm, a width (W) of about 50 µm to about 100 µm, and a gap (G) of about 60 µm to about 100 µm.

When the first and second electrodes are flat electrodes, these electrodes may have a thickness of about 500 Å to about 1,200 Å.

The first or second electrode may be formed of ITO, copper, silicon, IZO, and the like, as examples.

The flat electrode may have a thickness from 800 Å to 1200 Å, and the protruding electrode may have a height from 6 µm to 10 µm. When an insulation layer has a thickness from 4 µm to 12 µm, sufficient adhesion can be secured. For example, the flat electrode may have a thickness of 1,000 Å, and the protruding electrode may have a height of 8 µm. The insulation layer has a thickness from 6 µm to 10 µm.

According to another embodiment, a method for preparing a semiconductor device includes: performing preliminary compressing of an anisotropic conductive film disposed on a first connecting member including a first electrode; and performing primary compressing, after placing a second connecting member including a second electrode on the preliminarily compressed anisotropic conductive film. The anisotropic conductive film has a connection resistance of 10Ω or less when left under conditions of 85° C. and 85% RH for 500 hours after curing, and curing is performed at 190° C. to 210° C. for 5 seconds to 10 seconds at 50 MPa to 80 MPa. Preliminary compressing may be performed at 50° C. to 60° C. for 1 second to 5 seconds at 1.0 MPa to 5.0 MPa, and primary compressing may be performed at 150° C. to 250° C. for 2 seconds to 8 seconds at 60 MPa to 80 MPa.

In the method for preparing a semiconductor device, the anisotropic conductive film may have a bubble area between electrodes of 20% or less in a space area therebetween when left under conditions of 85° C. and 85% RH for 500 hours after curing. Within this range, the anisotropic conductive film may exhibit excellent reliability resistance under high-temperature/high-humidity conditions.

Any suitable method may be used to prepare the semiconductor device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Preparation of anisotropic conductive film including naphthalene ring-containing epoxy resin (X) and dicyclopentadiene ring-containing epoxy resin (Y) in specific content ratio (X:Y=1:1 to 5:1) [Examples 1 to 5]

EXAMPLE 1

Based on the total amount of an anisotropic conductive film composition in terms of solid content, 20 wt % of a phenoxy resin (YP50, Nippon Steel & Sumitomo Metal Co., Ltd.), 15 wt % of a naphthalene ring-containing epoxy resin (HP4032D, Dainippon Ink & Chemicals Inc.), 15 wt % of a dicyclopentadiene ring-containing epoxy resin (HP7200L, Dainippon Ink & Chemicals Inc.), 15 wt % of conductive particles (AUL704, Sekisui Chemical Co., Ltd.), 30 wt % of a curing agent (HX-3922, Asahi Kasei Co., Ltd.) and 5 wt % of silica nanoparticles (R812, Degussa GmbH) were mixed to prepare an anisotropic conductive film composition.

The composition was stirred at room temperature (25° C.) for 60 minutes at a stirring rate at which the conductive particles are not pulverized. A 35 µm thick film was formed on a silicone release surface-treated polyethylene base film using the composition, and a casting knife was used for film formation. The film was dried at 60° C. for 5 minutes.

EXAMPLE 2

An anisotropic conductive film was prepared in the same manner as in Example 1 except that 17.5 wt % of the naphthalene ring-containing epoxy resin and 12.5 wt % of the dicyclopentadiene ring-containing epoxy resin were used.

EXAMPLE 3

An anisotropic conductive film was prepared in the same manner as in Example 1 except that 20 wt % of the naphthalene ring-containing epoxy resin and 10 wt % of the dicyclopentadiene ring-containing epoxy resin were used.

EXAMPLE 4

An anisotropic conductive film was prepared in the same manner as in Example 1 except that 22.5 wt % of the naphthalene ring-containing epoxy resin and 7.5 wt % of the dicyclopentadiene ring-containing epoxy resin were used.

EXAMPLE 5

An anisotropic conductive film was prepared in the same manner as in Example 1 except that 25 wt % of the naphthalene ring-containing epoxy resin and 5 wt % of the dicyclopentadiene ring-containing epoxy resin were used.

COMPARATIVE EXAMPLE 1

An anisotropic conductive film was prepared in the same manner as in Example 1 except that the naphthalene ring-containing epoxy resin was not used and 30 wt % of the dicyclopentadiene ring-containing epoxy resin was used.

COMPARATIVE EXAMPLE 2

An anisotropic conductive film was prepared in the same manner as in Example 1 except that 5 wt % of the naphthalene ring-containing epoxy resin and 25 wt % of the dicyclopentadiene ring-containing epoxy resin were used.

COMPARATIVE EXAMPLE 3

An anisotropic conductive film was prepared in the same manner as in Example 1 except that 10 wt % of the naphthalene ring-containing epoxy resin and 20 wt % of the dicyclopentadiene ring-containing epoxy resin were used.

COMPARATIVE EXAMPLE 4

An anisotropic conductive film was prepared in the same manner as in Example 1 except that 30 wt % of the naphthalene ring-containing epoxy resin was used and the dicyclopentadiene ring-containing epoxy resin was not used.

Details of components constituting the anisotropic conductive films prepared in Examples 1 to 5 and Comparative Examples 1 to 4 are shown in Tables 1 and 2.

TABLE 1

|  |  | Example 1 | Example 2 | Example 3 | Example 4 | Example 5 |
|---|---|---|---|---|---|---|
| Phenoxy resin | | 20 | 20 | 20 | 20 | 20 |
| Epoxy resin | Naphthalene ring-containing epoxy (X) | 15 | 17.5 | 20 | 22.5 | 25 |
| | Dicyclopentadiene ring-containing epoxy (Y) | 15 | 12.5 | 10 | 7.5 | 5 |
| | Content ratio (X:Y) | 1:1 | 1.4:1 | 2:1 | 3:1 | 5:1 |
| Conductive particles | | 15 | 15 | 15 | 15 | 15 |
| Curing agent | | 30 | 30 | 30 | 30 | 30 |
| Silica nanoparticles | | 5 | 5 | 5 | 5 | 5 |
| Total | | 100 | 100 | 100 | 100 | 100 |

TABLE 2

|  |  | Comparative Example 1 | Comparative Example 2 | Comparative Example 3 | Comparative Example 4 |
|---|---|---|---|---|---|
| Phenoxy resin | | 20 | 20 | 20 | 20 |
| Epoxy resin | Naphthalene ring-containing epoxy (X) | — | 5 | 10 | 30 |
| | Dicyclopentadiene ring-containing epoxy (Y) | 30 | 25 | 20 | — |
| | Content ratio (X:Y) | — | 1:5 | 1:2 | — |
| Conductive particles | | 15 | 15 | 15 | 15 |
| Curing agent | | 30 | 30 | 30 | 30 |
| Silica nanoparticles | | 5 | 5 | 5 | 5 |
| Total | | 100 | 100 | 100 | 100 |

EXPERIMENTAL EXAMPLE 1: Measurement of Adhesion (Ball Tack) of Anisotropic Conductive Film In order to measure adhesive strength of each of the anisotropic conductive films of Examples 1 to 5 and Comparative Examples 1 to 4, testing was performed according to the following method using a probe tack tester (TopTack 2000A).

First, upper and lower load cells were carefully washed with MEK such that load did not exceed 200 gf, and dried for about 3 minutes. Next, with a double-sided tape attached to a sample stage of the probe tack tester, each anisotropic conductive film prepared in Examples 1 to 5 and Comparative Examples 1 to 4 was attached thereto. Then, adhesion of each anisotropic conductive film was measured under the following conditions:

1) Pressure: 200 gf
2) Separation speed: 0.08 mm/second
3) Dwell time: 20 seconds
4) Operating Temperature: 30° C.
5) Load cell: 1.0 kg
6) Probe jig size: ⅜ inch.

EXPERIMENTAL EXAMPLE 2: Measurement of Initial and Reliability Connection Resistance In order to measure initial and reliability connection resistance of the anisotropic conductive films of Examples 1 to 5 and Comparative Examples 1 to 4, each of the anisotropic conductive films was left at room temperature (25° C.) for 1 hour, and 10 specimens of each of the anisotropic conductive films were prepared by connecting the anisotropic conductive film to COF (Samsung Electronics Co., Ltd.) prepared by forming a pattern, which allows 4-probe measurement, on a 0.5t pattern-free glass plate coated with a 1000 Å thick ITO layer under preliminary compressing conditions of a measured temperature of 70° C., 1 second, and 1.0 MPa and primary compressing conditions of 200° C., 5 seconds, and 70 MPa. Then, initial connection resistance was measured (in accordance with ASTM F43-64T) on each of the specimens using a 4-probe method, and an average value was calculated.

After high-temperature and high-humidity reliability evaluation was performed by leaving the 10 specimens for each film under conditions of 85° C. and 85% RH for 500 hours, reliability connection resistance of each specimen was measured (in accordance with ASTM D117), and an average value was calculated.

EXPERIMENTAL EXAMPLE 3: Measurement of Initial and Reliability Bubble Area

In order to measure initial and reliability bubble areas of the anisotropic conductive films of Examples 1 to 5 and Comparative Examples 1 to 4, each of the anisotropic conductive films was left at room temperature (25° C.) for 1 hour, and 10 specimens of each of the anisotropic conductive films were prepared by connecting the anisotropic conductive film to COF (Samsung Electronics Co., Ltd.) prepared by forming a pattern, which allows 4-probe measurement, on 0.5t pattern-free glass plate coated with a 1000 Å thick ITO layer under preliminary compressing conditions of a measured temperature of 70° C., 1 second, and 1.0 MPa and primary compressing conditions of 200° C., 5 seconds, and 70 MPa. Then, after 10 points were photographed using an optical microscope, the initial bubble area between electrodes at each point was measured using an image analyzer, and an average value was calculated.

After high-temperature and high-humidity reliability evaluation was performed by leaving the 10 specimens for each film under conditions of 85° C. and 85% RH for 500 hours, the reliability bubble area between electrodes was measured in the same manner as above, and an average value was calculated.

EXPERIMENTAL EXAMPLE 4: Measurement of Moisture Absorption Rate

In order to measure the moisture absorption rates of the anisotropic conductive films of Examples 1 to 5 and Comparative Examples 1 to 4, the following method was performed.

After the anisotropic conductive film was left under conditions of 85° C. and 85% RH for 24 hours, the weight change of each film was measured and the weight increase ratio was calculated.

Results of Experimental Examples 1 to 4 are shown in Tables 3 and 4.

TABLE 3

|  |  | Example 1 | Example 2 | Example 3 | Example 4 | Example 5 |
|---|---|---|---|---|---|---|
| Adhesive strength (N/25 mm) |  | 30 | 45 | 50 | 63 | 95 |
| Initial | Connection resistance (Ω) | 0.07 | 0.06 | 0.05 | 0.06 | 0.05 |
|  | Bubble area (%) | ◯ | ◯ | ◯ | ◯ | ◯ |
| Reliability | Connection resistance (Ω) | 7.34 | 4.7 | 4.5 | 4.7 | 8.8 |
|  | Bubble area (%) | ◯ | ◯ | ◯ | ◯ | ◯ |
| Moisture absorption rate (%) |  | 0.56 | 0.57 | 0.55 | 0.61 | 0.65 |

TABLE 4

|  |  | Comparative Example 1 | Comparative Example 2 | Comparative Example 3 | Comparative Example 4 |
|---|---|---|---|---|---|
| Adhesive strength (N/25 mm) |  | 3 | 18 | 27 | 150 |
| Initial | Connection resistance (Ω) | 0.08 | 0.08 | 0.07 | 0.04 |
|  | Bubble area (%) | ◯ | ◯ | ◯ | Δ |
| Reliability | Connection resistance (Ω) | 94.6 | 37.3 | 28.4 | 10.3 |
|  | Bubble area (%) | X | X | X | Δ |
| Moisture absorption rate (%) |  | 0.86 | 0.85 | 0.96 | 0.88 |

In evaluation of the bubble area among evaluation items of Tables 3 and 4, in the space between electrodes, a bubble area exceeding 0% and 20% or less was evaluated as O, a bubble area exceeding 20% and 50% or less was evaluated as Δ, and a bubble area exceeding 50% and 100% or less was evaluated as X.

As shown in Tables 3 and 4, in Examples 1 to 5 and Comparative Examples 2 and 3, the anisotropic conductive films including the naphthalene ring-containing epoxy resin and the dicyclopentadiene ring-containing epoxy resin exhibited excellent properties in terms of initial connection resistance and bubble area. However, it was confirmed that the anisotropic conductive films of Examples 1 to 5 having a 1:1 to 5:1 ratio of the epoxy resins exhibited considerable difference in reliability connection resistance and bubble properties depending on the content ratio of the two epoxy resins, as compared with the films of Comparative Examples 2 and 3.

In particular, when the two epoxy resins were present in a content ratio from 1:1 to 5:1 (Examples 1 to 5), the films had a moisture absorption rate of 0.8% or less and thus exhibited improved moisture resistance by ensuring desirable connection resistance and bubble properties after high-temperature and high-humidity reliability evaluation.

The film of Comparative Example 1 had low adhesive strength, high connection resistance after reliability evaluation and a large bubble area. Additionally, despite good adhesion, the film of Comparative Example 4 had a connection resistance of exceeding 10Ω and a larger bubble area than the films of Examples 1 to 5.

By way of summation and review, recent technical development shows a trend toward lighter, thinner, shorter and smaller driver ICs and panels. However, warpage of glass may become more severe upon thermal curing of an anisotropic conductive film as the thickness of driver ICs and panels becomes thinner. Accordingly, issues regarding deterioration of connection reliability may arise.

It is desirable that an anisotropic conductive film for COG connect a driver IC and a glass electrode under a uniform pressure and maintain connection reliability for long duration even under high temperature and high humidity conditions. Accordingly, studies for improvement of heat resistance and moisture resistance of anisotropic conductive films have been actively conducted.

For improvement of heat resistance of anisotropic conductive films, an anisotropic conductive film may use an aromatic ring-containing epoxy resin which has high viscosity upon curing and a high $T_g$ after curing. The aromatic ring-containing epoxy resin used as a material of the anisotropic conductive film may provide excellent heat resistance and excellent pressure uniformity at left, middle, and right portions of an electrode of a driver IC. However, issues of deterioration in connection reliability may arise since such a film composition may not sufficiently fill the space between microelectrodes upon curing of the anisotropic conductive film.

Therefore, an anisotropic conductive film that exhibits excellent connection reliability even under high temperature and high humidity conditions by ensuring excellent heat resistance and sufficient filling of the film between microelectrodes is desirable.

Embodiments provide a semiconductor device connected by an anisotropic conductive film that exhibits excellent connection reliability even under high temperature and high humidity conditions by ensuring excellent properties in terms of heat resistance and moisture resistance.

Embodiments provide a semiconductor device connected by an anisotropic conductive film that includes at least two types of epoxy resins exhibiting high heat resistance and/or moisture resistance and having different melting viscosities upon curing to exhibit excellent connection reliability by ensuring uniform filling of the film between microelectrodes upon primary compressing.

Embodiments provide a semiconductor device connected by an anisotropic conductive film that includes at least two types of epoxy resins having different melting viscosities upon curing and exhibits high heat resistance and high moisture resistance.

More particularly, embodiments provide an anisotropic conductive film that includes a naphthalene ring-containing epoxy resin having high viscosity upon curing and a dicyclopentadiene ring-containing epoxy resin having low viscosity upon curing.

Embodiments provide a semiconductor device that includes an anisotropic conductive film that is disposed between first and second connecting members, and that includes a naphthalene ring-containing epoxy resin and a dicyclopentadiene ring-containing epoxy resin having different melting viscosities upon curing to exhibit excellent properties in terms of heat resistance and moisture resistance.

More particularly, embodiments provide a semiconductor device that includes an anisotropic conductive film that is disposed between first and second connecting members and that includes a dicyclopentadiene ring-containing epoxy resin, which has a high $T_g$ after curing and low melting viscosity upon curing and exhibits high heat resistance and moisture resistance to allow appropriate adjustment of melting viscosity of a film composition, whereby the film can sufficiently and uniformly fill spaces between microelectrodes upon compressing.

Thus, the semiconductor device exhibits excellent connection reliability even under high temperature and high humidity conditions since the anisotropic conductive film can sufficiently fill the spaces between microelectrodes.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope as set forth in the following claims.

What is claimed is:

1. A liquid crystal display device, comprising:
    a first connecting member having a first electrode;
    a second connecting member having a second electrode; and
    an anisotropic conductive film filling an entire space between the first connecting member and the second connecting member, the anisotropic conductive film electrically connecting the first and second electrodes to each other, and the anisotropic conductive film including:
    a polymer binder resin selected from the group consisting of a polyimide resin, a polyamide resin, a phenoxy resin, a polyvinyl butyral resin, and in combination thereof;
    an epoxy resin;
    conductive particles;
    a curing agent; and
    silica nanoparticles,
    wherein the epoxy resin includes a naphthalene ring-containing epoxy resin and a dicyclopentadiene ring-containing epoxy resin,
    the naphthalene ring-containing epoxy resin is present in an amount of 300 parts by weight to 500 parts by weight, based on 100 parts by weight of the dicyclopentadiene ring-containing epoxy resin, and
    the anisotropic conductive film has a melting viscosity from 0.2 Pa·s to 0.5 Pa·s at 150° C.,
    wherein the anisotropic conductive film includes:
    5 wt% to 35 wt% of the polymer binder resin;
    5 wt% to 25 wt% of the epoxy resin;
    5 wt% to 30 wt% of the conductive particles;
    30 wt% to 50 wt% of the curing agent, and
    0.1 wt% to 20 wt% of the silica nanoparticles, based on a total amount of the anisotropic conductive film in terms of solid content, and
    wherein, after curing and after being subjected to conditions of 85° C. and 85% RH for 500hours, the anisotropic conductive film has a bubble area between the first and second electrodes of 20% or less in a space area therebetween.

2. The liquid crystal display device as claimed in claim 1, wherein the anisotropic conductive film has a moisture absorption rate of 0.8% or less.

3. The liquid crystal display device as claimed in claim 1, wherein the anisotropic conductive film has an adhesive strength from 30 N/25 mm to 100 N/25 mm.

4. The liquid crystal display device as claimed in claim 1, wherein the dicyclopentadiene ring-containing epoxy resin has a melting viscosity from 0.1 Pa·s to 1 Pa·s at 150° C.

5. The liquid crystal display device as claimed in claim 1, wherein the anisotropic conductive film, after curing and after being subjected to conditions of 85° C. and 85% RH for 500 hours, has a connection resistance of 10Ω or less.

6. The liquid crystal display device as claimed in claim 5, wherein the curing is performed at 190° C. to 210° C. for 5 seconds to 10 seconds at a load of 50 MPa to 80 MPa.

* * * * *